(12) United States Patent
Wesson et al.

(10) Patent No.: US 10,116,383 B2
(45) Date of Patent: Oct. 30, 2018

(54) OUTPHASING AMPLIFIER

(71) Applicant: NXP B.V., Eindhoven (NL)

(72) Inventors: Robin Wesson, Breda (NL); Mustafa Acar, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/427,092

(22) Filed: Feb. 8, 2017

(65) Prior Publication Data

US 2017/0230106 A1    Aug. 10, 2017

(30) Foreign Application Priority Data

Feb. 9, 2016 (EP) .................................. 16154891

(51) Int. Cl.
*H04B 7/26* (2006.01)
*H03F 3/19* (2006.01)
*H04W 52/52* (2009.01)

(52) U.S. Cl.
CPC ............... *H04B 7/26* (2013.01); *H03F 3/19* (2013.01); *H04W 52/52* (2013.01); *H03F 2200/336* (2013.01); *H03F 2200/451* (2013.01)

(58) Field of Classification Search
CPC ............... H04B 7/26; H03F 2200/336; H03F 2200/451; H03F 3/19; H04W 52/52
USPC .......... 375/220, 297; 330/127, 185; 455/102
See application file for complete search history.

(56) References Cited

U.S. PATENT DOCUMENTS

| | | | |
|---|---|---|---|
| 6,889,034 B1 * | 5/2005 | Dent | H04B 1/0458 455/102 |
| 2008/0075194 A1 | 3/2008 | Ravi et al. | |
| 2009/0072898 A1 * | 3/2009 | Sorrells | H03F 1/0294 330/127 |
| 2013/0049861 A1 | 2/2013 | Lozhkin | |

FOREIGN PATENT DOCUMENTS

WO    WO-01/099439 A2    12/2001
WO    WO-01/099439 A3    12/2001

\* cited by examiner

*Primary Examiner* — Chieh M Fan
*Assistant Examiner* — Fitwi Hailegiorgis

(57) ABSTRACT

An outphasing amplifier having: a first branch arranged to receive and process a first branch signal, the first branch signal being phase modulated, with constant amplitude envelope; and a second branch arranged to receive and process a second branch signal, the second branch signal being phase modulated, with constant amplitude envelope, and at least a portion of the second branch signal anti-phase from the first branch signal, wherein each branch includes: circuitry arranged to process the signal to reduce the energy in sidebands of the signal away from the central frequency, while retaining the phase information in the signal; and an amplifier arranged to amplify the filtered and re-asserted branch signal.

14 Claims, 8 Drawing Sheets

OUTPHASING AMPLIFIER

CROSS-REFERENCE TO RELATED APPLICATIONS

This application claims the priority under 35 U.S.C. § 119 of European patent application no. 16154891.2, filed Feb. 9, 2016 the contents of which are incorporated by reference herein.

FIELD

The present disclosure relates to an outphasing amplifier, and to a method for mitigating bandwidth expansion in an outphasing amplifier.

BACKGROUND

Amplitude modulation is used (with or without the addition of phase modulation) in a wide variety of communications systems such as mobile phones, cellular base stations for mobile phones and satellite communications.

It is often necessary to amplify amplitude and potentially also phase modulated RF signals. Conventional amplifiers have a generally linear relationship between input power and output power, during normal operation. As input power increases, efficiency and output power both increase. This means that high input power, leading to compression at the output, is necessary for high efficiency to be achieved. Eventually, the amplifier is driven into saturation where the relationship between input power and output power is non-linear. In saturation, the output power does not increase with further increases of input power level.

It is conventionally undesirable to operate an amplifier in saturation because driving an amplifier in the non-linear region also increases distortion of the signal. This means that when amplifying RF signals with high input peak to average power ratio, conventional amplifiers cannot be used in the high-efficiency region, they have to be used in their linear region, where efficiency is much lower.

One option to overcome this is to use outphasing amplifiers, such as Chireix amplifiers. In an outphasing amplifier, the amplitude part of an amplitude (and phase) modulated input signal is converted into two phase modulated signals, with constant amplitude envelopes. The phase modulated signals include the phase of the original signal as a common part, and additional antiphase components that, when recombination occurs, recreate the amplitude content of the original signal. The phase modulated signals are amplified by a pair of branch amplifiers, and combined to provide an amplified amplitude modulated output signal. Because of the constant amplitude envelope of the phase modulated signals passed to the branch amplifiers, the branch amplifiers can be operated at saturation, resulting in maximum efficiency.

SUMMARY

According to a first aspect of the invention, there is provided an outphasing amplifier having: a first branch arranged to receive and process a first branch signal, the first branch signal being phase modulated, with constant amplitude envelope; and a second branch arranged to receive and process a second branch signal, the second branch signal being phase modulated, with constant amplitude envelope, and at least a portion of the second branch signal anti-phase from the first branch signal, wherein each branch includes: circuitry arranged to process the signal to reduce the energy in sidebands of the signal away from the central frequency, while retaining the phase information in the signal; and an amplifier arranged to amplify the filtered and re-asserted branch signal.

The circuitry arranged to process the signal may include: a frequency filter arranged to filter the branch signal to reduce the bandwidth of the branch signal; and a reconstructor arranged to modify at least a portion of the filtered branch signal, to reassert the phase information from the unfiltered branch signal.

The reconstructor may be arranged to modify the phase of at least a portion of the filtered branch signal based on information taken from the unfiltered branch signal.

The branch signal may comprise information encoded in in-phase and quadrature components, and wherein the filter is arranged to filter the in-phase and quadrature components separately.

The reconstructor may include: a first converter arranged to convert the filtered in-phase and quadrature components into first magnitude and phase information; a second converter arranged to convert the unfiltered in-phase and quadrature components into second magnitude and phase information; and a third converter arranged to convert the magnitude of the first magnitude and phase information and the angle of the second magnitude and phase information into output in-phase and quadrature information, the filtered and re-asserted branch signal comprising the output in-phase and quadrature components.

The circuitry may be arranged to filter and reassert the branch signal a plurality of times.

The branch signal may comprise a first range of frequencies, extending around a central frequency; and the processed signal comprises the first range of frequencies, wherein the energy in the filtered and re-asserted branch signal away from the central frequency is reduced compared to the unfiltered branch signal.

The outphasing amplifier may include: a signal separator arranged to receive an amplitude modulated RF input signal, and arranged to generate the first branch signal and the second branch signal from the input signal, such that combination of the processed first branch signal and the processed second branch signal provides an amplified version of the input signal.

The input signal may comprise information encoded in in-phase and quadrature components, the outphasing amplifier comprising: a first digital to analogue converter for generating the in-phase component of the input signal; and a second digital to analogue converter for generating the quadrature component, wherein the reduction of energy in the sidebands reduces the required operational bandwidth of the first digital to analogue converter and the second digital to analogue converter.

According to a second aspect of the invention, there is provided a method for mitigating bandwidth expansion in an outphasing amplifier, the outphasing amplifier including a first branch arranged to receive and process a first branch signal, the first branch signal being phase modulated, with constant amplitude envelope, and a second branch arranged to receive and process a second branch signal, the second branch signal being phase modulated, with constant amplitude envelope, and at least a portion of the second branch signal anti-phase from the first branch signal, the method including, in each branch: processing the branch signal to reduce energy in sidebands of the signal away from the central frequency, while retaining the phase information in the signal; and amplifying the processed signal.

Processing the branch signal may include: filtering the branch signal to reduce the bandwidth of the branch signal; and modifying at least a portion of the filtered branch signal, to reassert the phase information from the unfiltered branch signal.

Modifying at least a portion of the filtered branch signal may include: modifying the phase of at least a portion of the filtered branch signal based on information taken from the unfiltered branch signal.

The branch signal may comprise information encoded in in-phase and quadrature components, and wherein the filter filters the in-phase and quadrature components separately.

The method may include: converting the filtered in-phase and quadrature components into first magnitude and phase information; converting the unfiltered in-phase and quadrature components into second magnitude and phase information; and converting the magnitude of the first magnitude and phase information and the angle of the second magnitude and phase information into output in-phase and quadrature information, the filtered and re-asserted branch signal comprising the output in-phase and quadrature components.

According to a third aspect of the invention, there is provided a base station for mobile phone or cellular communications, comprising an amplifier according to the first aspect.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which FIG. 1 schematically illustrates one example embodiment of an outphasing amplifier.

Figure 1:
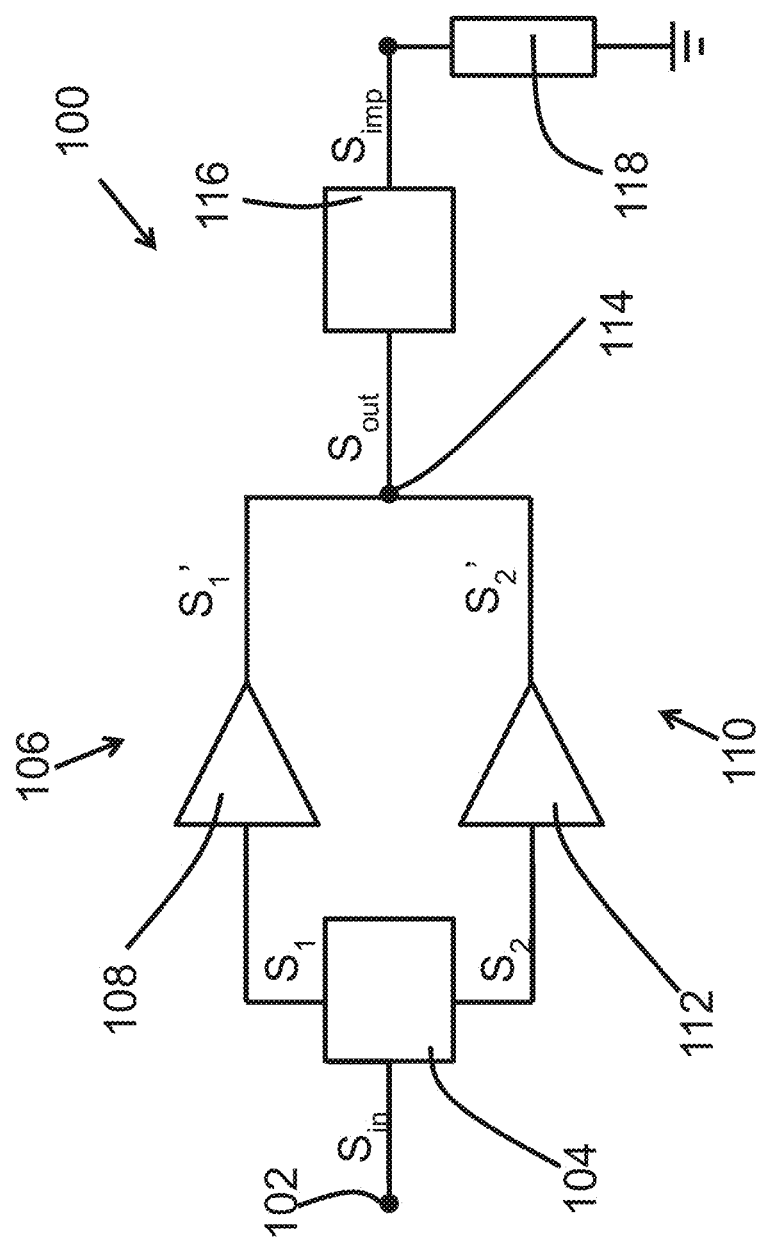

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 shows a schematic illustration of an outphasing amplifier 100. An amplitude modulated RF input signal $S_{in}$ is provided to the RF input node 102 of the outphasing amplifier 100. The input signal is then passed to a signal separator 104, which separates the amplitude modulated input signal $S_{in}$ into two separate phase modulated signals $S_1$, $S_2$ (branch signals). The branch signals $S_1$, $S_2$ both have a constant amplitude envelope, and are identical, but are separated in phase by an outphasing angle.

In one example, the relationship between the input signal $S_{in}$, and the branch signals $S_1$, $S_2$ may be described by:

$$S_{in}(t) = A(t)\cos(\omega t + \varphi(t)) \quad (1)$$

$$S_1(t) = \cos(\omega t + \varphi(t) + \theta(t)) \quad (2a)$$

$$S_2(t) = \cos(\omega t + \varphi(t) - \theta(t)) \quad (2b)$$

$$\theta(t) = \arccos\left(\frac{A(t)}{2}\right) \quad (3)$$

$\theta(t)$ is the outphasing angle of the amplifier.

The first branch signal $S_1$ is passed onto a first amplification branch 106 of the outphasing amplifier 100. The first amplification branch 106 includes a first branch amplifier 108 which amplifies the first branch signal $S_1$ to give a first amplified signal component $S_1'$.

The second branch signal $S_2$ is passed onto a second amplification branch 110 of the outphasing amplifier 100. The second amplification branch 110 includes a second branch amplifier 112 which amplifies the second branch signal $S_2$ to give a second amplified signal component $S_2'$.

Using the example branch signals from equations 2a and 2b, the amplified signal components $S_1'$, $S_2'$ may be given by:

$$S_1'(t)=g_1 \cos(\omega t+\varphi(t)+\theta(t)) \quad (4a)$$

$$S_2'(t)=g_2 \cos(\omega t+\varphi(t)-\theta(t)) \quad (4b)$$

$g_1$ and $g_2$ are the gains of the first 108 and second 112 branch amplifiers respectively. In some examples, the branch amplifiers 108, 112 have the same gain. In other examples, the branch amplifiers 108, 112 may have different gains.

The amplified signal components $S_1'$, $S_2'$ are passed to a combiner 114, where they are summed to give the amplified output signal $S_{out}$.

Using the above example signals, $S_{out}$ may be given by:

$$S_{out}(t)=S_1'(t)+S_2'(t)=G \cdot A(t)\cos(\omega t+\varphi(t)) \quad (5)$$

As will be appreciated by comparison of equations 1 and 5, the amplified output signal $S_{out}$ is simply a scaled increase of the input signal $S_{in}$. Therefore, the outphasing amplifier 100 has amplified the input signal $S_{in}$ by a factor G. G is the gain of the outphasing amplifier 100.

In a base station or other application, the output signal $S_{out}$ may be provided for transmission or further downstream processing. In FIG. 1, this is modelled by the output load 118. The output load 118 has a characteristic impedance $Z_0$.

For efficient operation of the base station and the outphasing amplifier 100 the output signal $S_{out}$ should be impedance matched to the characteristic impedance $Z_0$. Where the output signal $S_{out}$ is not impedance matched to the characteristic impedance $Z_0$, the output signal $S_{out}$ may be passed through an impedance matching network 116 to translate the output signal $S_{out}$ in to an impedance matched signal $S_{imp}$.

Impedance matching networks are well known in the art of amplifiers.

Figure 2:
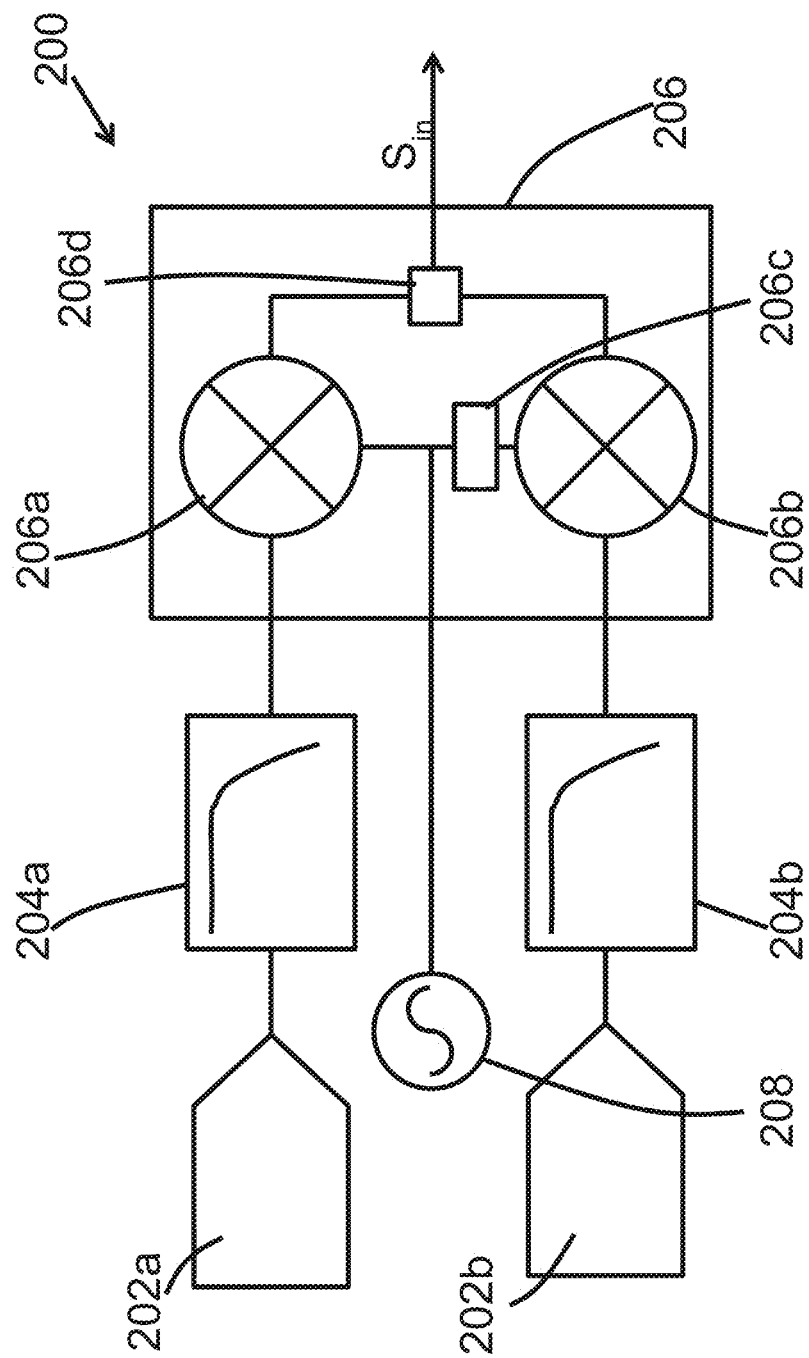
FIG. 2 schematically illustrates one example embodiment of a baseband unit for generating an input signal.

In some examples, the input signal $S_{in}$ and output signal $S_{out}$ include information (amplitude and phase) encoded in baseband as in-phase (I) and quadrature (Q) components. FIG. 2 schematically illustrates a baseband unit 200 that can be used to generate the input signal $S_{in}$. Alternatively, single ended representation can be used in baseband, requiring fewer but higher performance data converters.

The I and Q components of the signal are generated as separate digital components by the base station. The digital I component is converted into a first analogue signal by a first digital to analogue converter 202a, and the digital Q component is converted into a second analogue signal by a second digital to analogue converter 202b.

The first analogue signal is filtered by a first filter 204a, and the second analogue signal is filtered by a second filter 204b. The filters 204 are digital to analogue converter reconstruction filters, as required by digital to analogue converters. The filtered analogue signals are then provided to a quadrature modulator 206, where they are mixed with a signal from a local oscillator 208, and summed to provide the input signal $S_{in}$.

The quadrature modulator 206 includes a first modulator 206a for mixing the first analogue signal with the output of the local oscillator, and a second modulator 206b for mixing the second analogue signal with the output of the local oscillator 208. Before mixing with the second analogue signal, the output of the oscillator 208 is passed through a 90 degree phase shift 206c. The quadrature modulator 206 also includes a summer 206d for summing the mixed analogue signals.

Figure 3A:
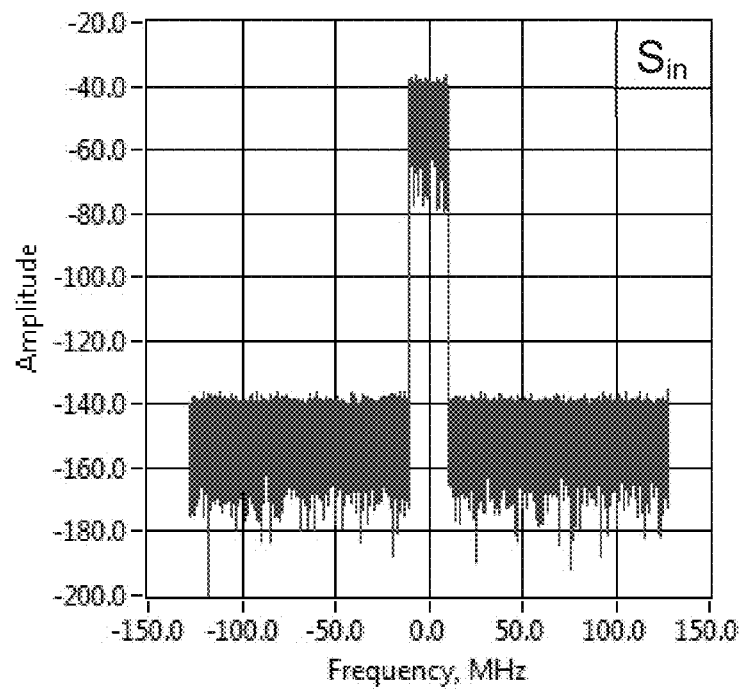
FIG. 3A illustrates the spectrum of an RF input signal.

FIG. 3A illustrates the frequency spectrum of a 20 MHz RF input signal, $S_{in}$. The x-axis shows the frequency variation from 20 MHz. As can be seen from FIG. 3A, the input signal $S_{in}$ is of relatively narrow bandwidth, with the amplitude of the signal (and hence information in the signal) dropping off away from the main frequency.

Figure 3B:
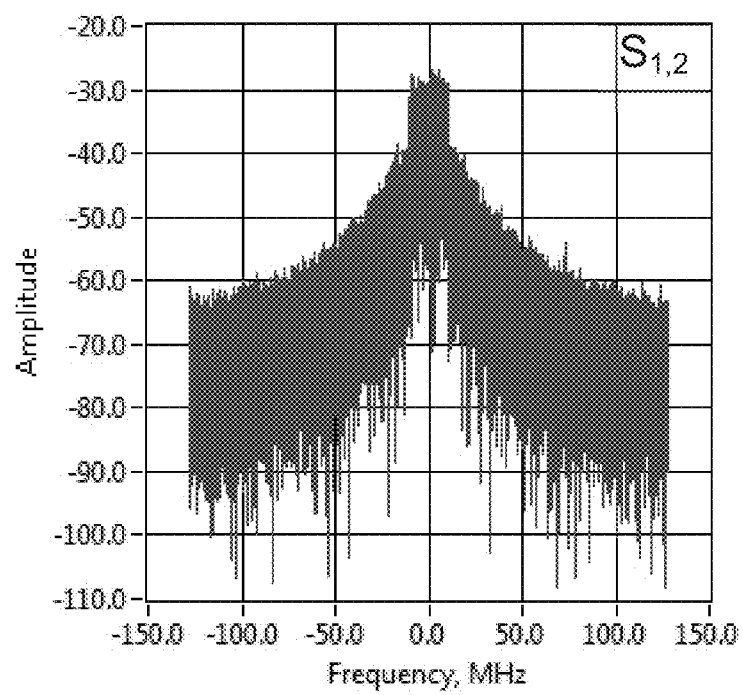
FIG. 3B illustrates the spectrum of an outphased signal derived from the input signal of FIG. 3A.

FIG. 3B illustrates the frequency spectrum of the outphased signal ($S_1$ or $S_2$) generated from the input signal of FIG. 3A. As can be seen, the signal is now of wide bandwidth. This is known as bandwidth expansion. Wideband signals place greater power requirements on the digital to analogue converters 202, modulators 206a,b, and filter circuitry 204 in the baseband unit 200, and in the branches of the amplifier 106, 110, and the branch amplifiers 108, 112.

Figure 4:
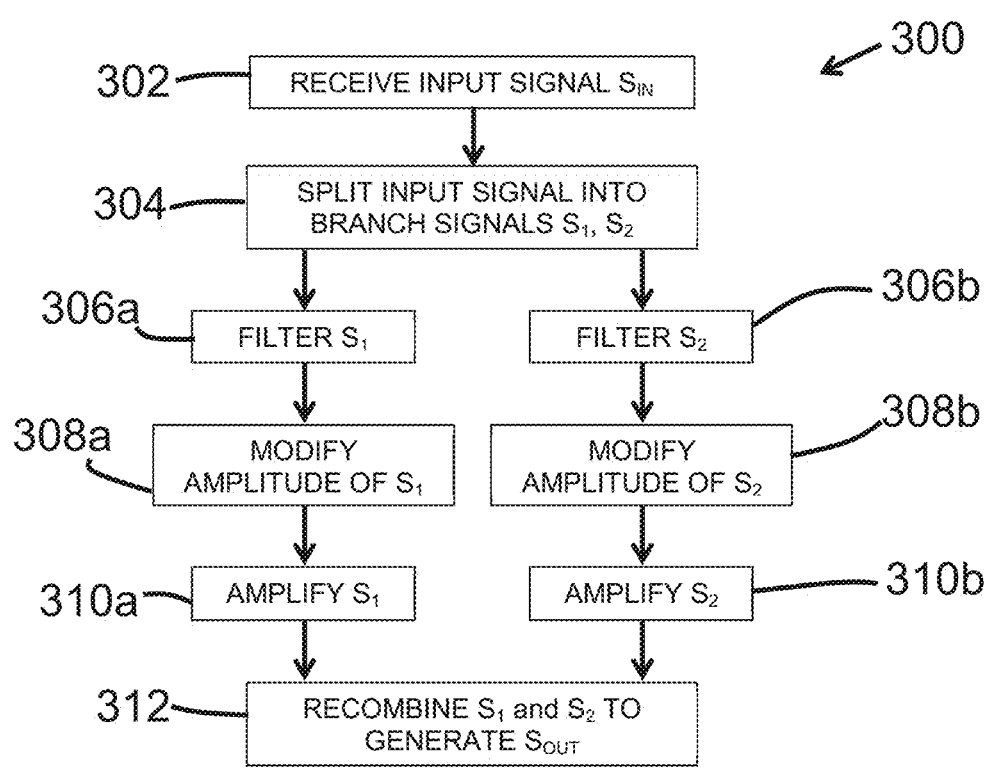
FIG. 4 illustrates a method for mitigating bandwidth expansion, according to an embodiment of the invention.

FIG. 4 illustrates the steps of a method 300 for mitigating the effect of bandwidth expansion, according to an embodiment. In general, each of the branch signals is processed to reduce the energy in the wide bandwidths, created by the translation to phase only information content. The wide bandwidths are the frequencies away from the central frequency of the signal. The reduction of the power in the wide bandwidths reduces the bandwidth requirements for the components of the amplifier 100, reducing component cost and power consumption. Furthermore, the processing of the signal preserves the phase information, so no data is lost from the signal.

In one example, the processing includes a step of filtering 306 the branch signal to reduce the bandwidth of the signal, and a step of modifying the filtered branch signal 308 to reassert the phase information. The reasserting of the phase information ensures no phase information is lost, and can be seen as reintroducing phase accuracy into the branch signal after the filtering, or as altering the amplitude of the branch signal after filtering to restore the content of the original signal.

One example of operating an amplifier 100 will now be discussed in more detail. In a first step, the input signal $S_{in}$ is received 302. In a second step, the input signal is split 304, into the outphased branch signals of constant amplitude envelope $S_1$, $S_2$.

The first branch signal $S_1$ is filtered 306a on the first branch 106 of the amplifier 100, and the second branch signal $S_2$ is filtered on the second branch 110 of the amplifier 100.

The filtering reduces the bandwidth of the outphased signals $S_1$, $S_2$. The filtering is by a simple band-pass filter that only allows frequency components within a predefined range around the central frequency to pass. For example, the band pass bandwidth may be ⅓ the sample rate of the system. Thus, a lower bandwidth signal equates to lower specification hardware in the RF signal generation system, reducing component cost and complexity. It will be appreciated that the band pass bandwidth of ⅓ the sample rate is by way of example only, and any suitable bandwidth may be used.

Figure 5A:
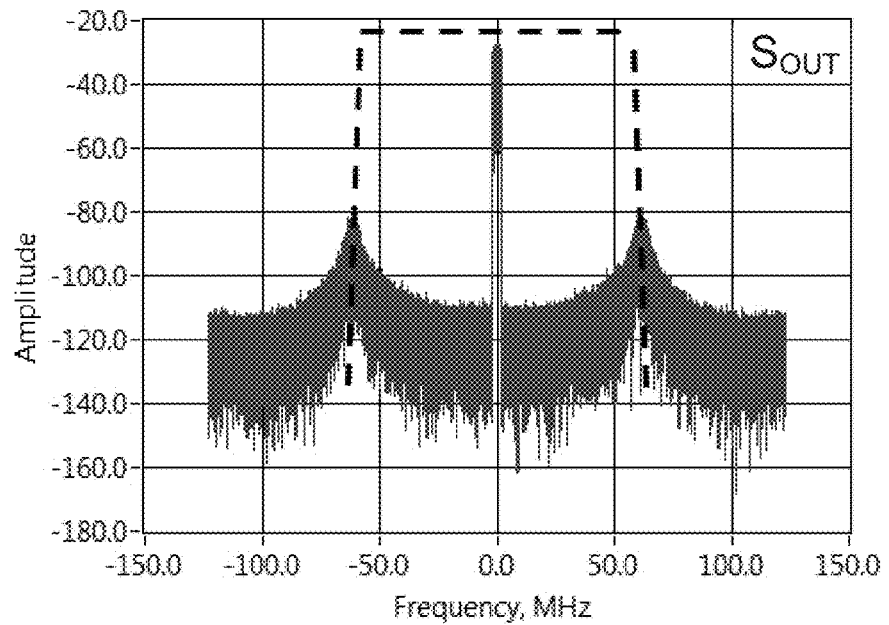
FIG. 5A illustrates the spectrum of an output signal where the branch signals have been filtered.

FIG. 5A shows a spectrum of an output signal $S_{out}$ generated by combining two amplified outphased signals, $S_1'$, $S_2'$, which have been filtered prior to amplification. The dashed line shows the shape of the filter applied to the outphased signals.

As can be seen, the filtering step 306 results in sidebands with high amplitude (and thus high energy). These sidebands result in distortion on the signal, and also mean that the signal is still wideband. Furthermore, because the branch signals are phase modulated, carrying information in their phase, filtering can result in loss of information in the signal.

Therefore, after filtering, 306, the first branch signal $S_1$ is modified 308a to reintroduce phase information from the unfiltered signal. The effect of this modification is to alter the amplitude of parts of the signal, and reasserts the information from the original signal. Similarly, the second branch signal $S_2$ is modified 308b in a similar manner.

Figure 5B:
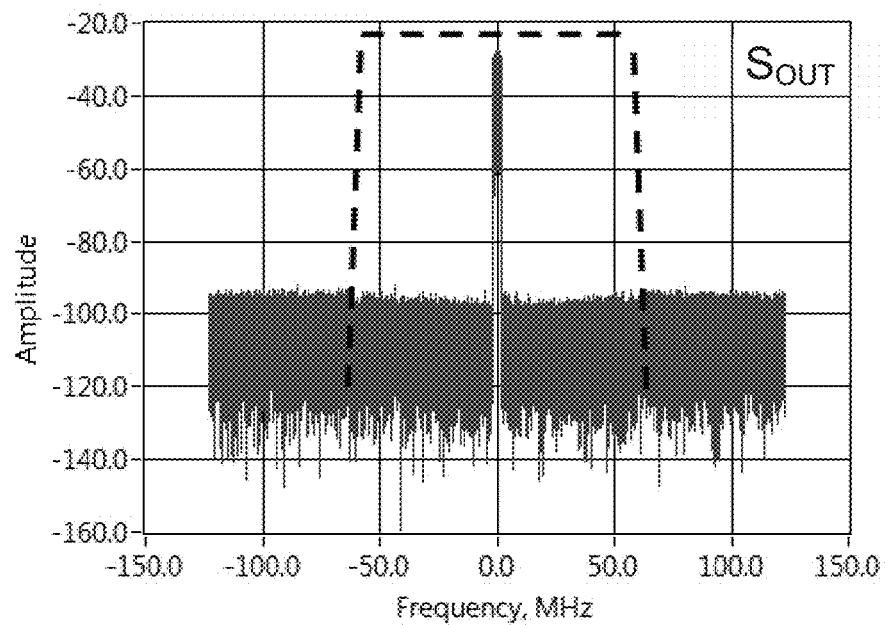
FIG. 5B illustrates the spectrum of an output signal where the branch signals have been filtered and reasserted.

FIG. 5B shows the spectrum of an output signal $S_{out}$ generated by combining two amplified outphased signals, $S_1'$, $S_2'$, which have been filtered and reasserted prior to amplification.

As can be seen, reasserting the information modifies the amplitude in a way that reduces the energy in the sidebands. Since the sidebands are lower energy, the effect of the bandwidth expansion is reduced, as will be discussed below.

To further mitigate the effect of bandwidth reduction, the steps of filtering 306 and reasserting 308 can be repeated.

Figure 6A:
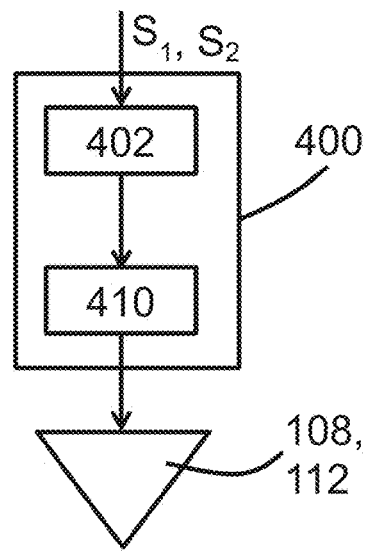
FIG. 6A schematically illustrates the processing circuitry required for mitigating bandwidth expansion

After modification 308 of the first branch signal $S_1$ and the second branch signal $S_2$, the first branch signal $S_1$ is amplified 310a and the second branch signal $S_2$ is amplified 310b. The amplified signals $S_1'$, $S_2'$ are then combined 312 to provide $S_{out}$. FIG. 6A schematically illustrates the processing circuitry 400 required to process the branch signals is to reduce the energy in the wide bandwidths, i.e. those away from the central frequency of the signal.

In one example, the processing circuitry 400 includes a filter 402 to filter the branch signal as discussed above, and a reconstructor 410 to modify the filtered branch signal, as also discussed above.

Figure 6B:
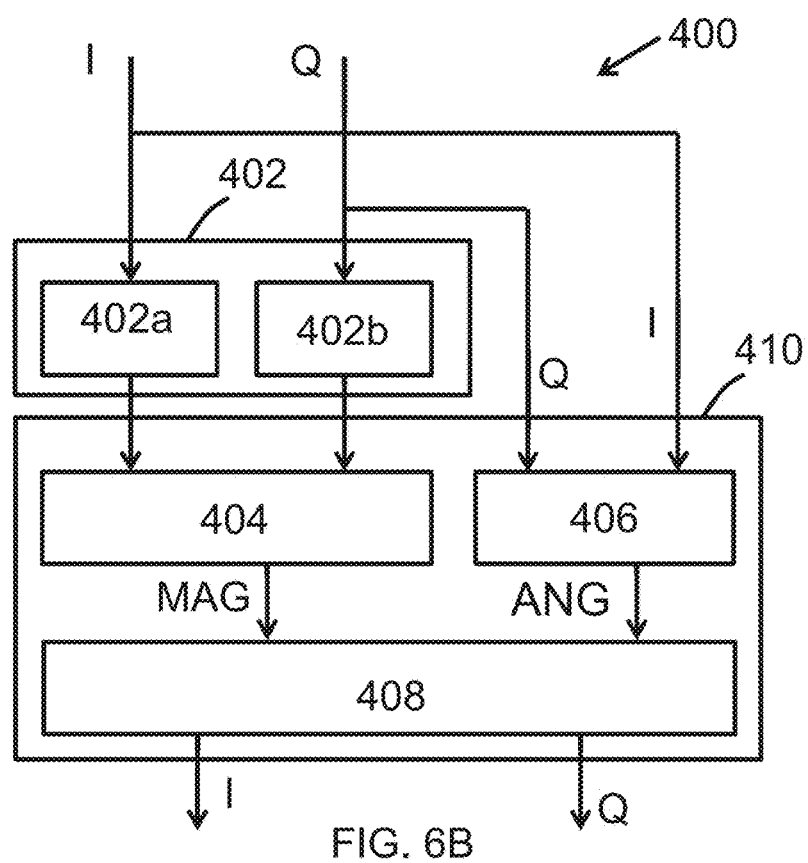
FIG. 6B illustrates the processing circuitry of FIG. 6A in more detail.
Figure 6C:
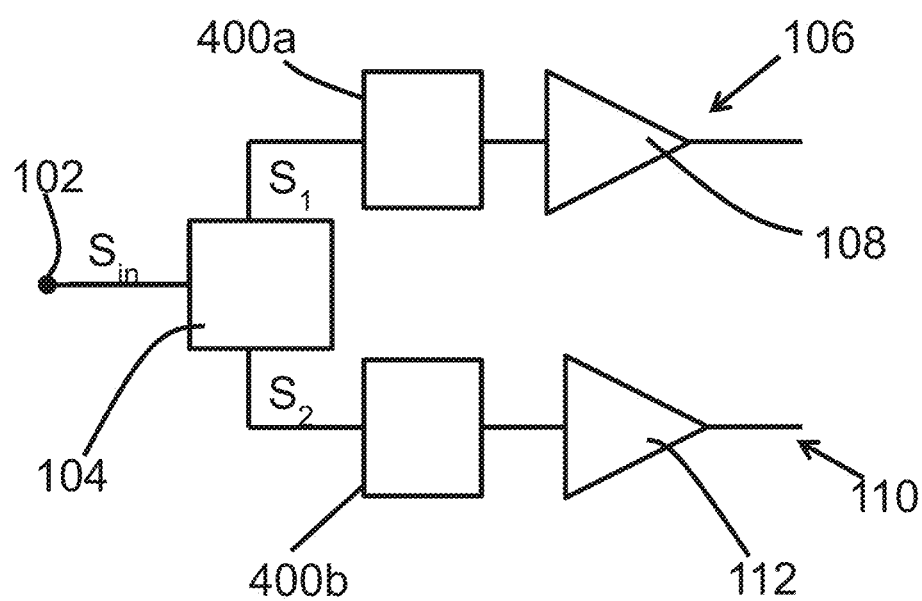
FIG. 6C schematically illustrates the processing circuitry of FIG. 6A in the amplifier of FIG. 1.

FIG. 6C shows a portion of the amplifier of FIG. 1, including the processing circuitry 400a, 400b. First processing circuitry 400a is provided on the first branch 106, to process the first branch signal $S_1$. Second, identical, processing circuitry 400b is provided on the second branch to process the second branch signal $S_2$.

FIG. 6B shows one example embodiment of the processing circuitry 400 in more detail. The operation of this processing circuitry 400 will now be discussed in relation to a single branch signal $S_1$, $S_2$, although it will be appreciated that the processing circuitry in both branches 106, 110 will function in the same way.

As with the input signal $S_{in}$, the branch signals $S_1$, $S_2$ include information encoded in I and Q components, which are received by the processing circuitry 400. The I and Q components may be generated by the signal separator 104, or may be determined from the signals from the signal generator 104 in any suitable manner.

The filter 402 includes a first filter 402a for filtering the I component, and a second filter 402b for filtering the Q component. The filters 402 are as discussed in relation to FIG. 4.

The reconstructor 410 includes a first converter 404, a second converter 406, and a third converter 408. The converters 404, 406, 408 are arranged to alter between different signal representations. Using the I and Q components is only one way of representing information encoded in a signal. An alternative method is to use magnitude (MAG) and angle (ANG) information. The converters 404, 406, 408 use a CORDIC algorithm to switch between these two systems.

The first converter 404 converts the filtered I and Q components into first magnitude and angle information including a first magnitude and a first angle. The second converter 406 converts the unfiltered I and Q components into second magnitude and angle information including a second magnitude and a second angle.

The third converter 408 takes the first magnitude, and the second angle, and converts back to I and Q components. The filtered magnitude provides the effect of filtering, whilst the unfiltered angle information reasserts the original phase information.

The output of the third converter is not the direct I and Q signal, but the information required to generate the I and Q signal. This information is passed to respective digital to analogue converters (not shown), and then processed as normal. The digital to analogue converters may include reconstruction filters (not shown) as discussed in relation to the digital to analogue converters of FIG. 2. Following the filtering and reassertion, the reconstruction filters introduce minimal distortion.

The amplifiers 108, 112 are limiting amplifiers, operated at saturation. The amplifiers 108, 112 take the output from the processing circuitry, and amplify it. The distortion of the limiting amplifier modifies the signal such that the amplified branch signals are of the form required to create the amplified output signal. In this way, the system 100 can be seen to use the distortion of the amplifier 108, 112 to insert additional information lost in filtering.

Since the amplifiers 108, 112 are limiting amplifiers, the system 100 can be used to amplify digital signals, removing the need for digital to analogue converters, reducing cost and power requirements.

Figure 7A:
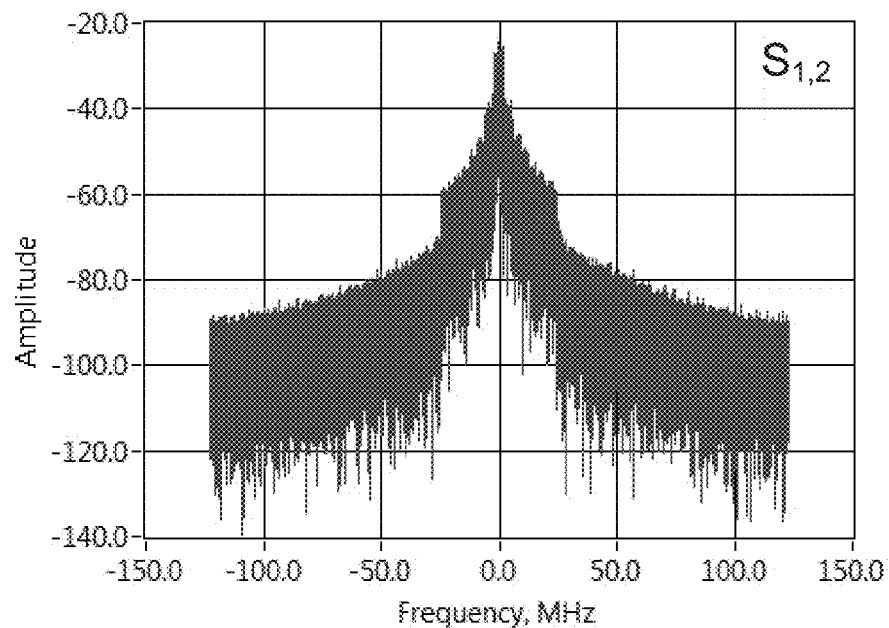
FIG. 7A illustrates the spectrum of a branch signal following a single step of filtering and reassertion.

FIG. 7A shows the spectrum of the branch signal following a single iteration of filtering and reassertion. Comparison with FIG. 3B shows that the outphased, filtered and phase-reasserted signal has lower signal power at wide bandwidths than the original outphased signal. However, the signal at wide bandwidths is higher than in a signal that is only filtered, and so the phase information is not lost, but the bandwidth requirements on the amplifier 100 are reduced.

The largest reduction of the power occurs at the highest and lowest frequencies, and the central frequency is largely unaffected. The power reduction gradually increases from the central frequency to the widest frequencies. In general, the power reduction is most significant in the frequencies outside of the pass band of the filter, although some reduction in power may be seen at frequencies within the pass band.

Figure 7B:
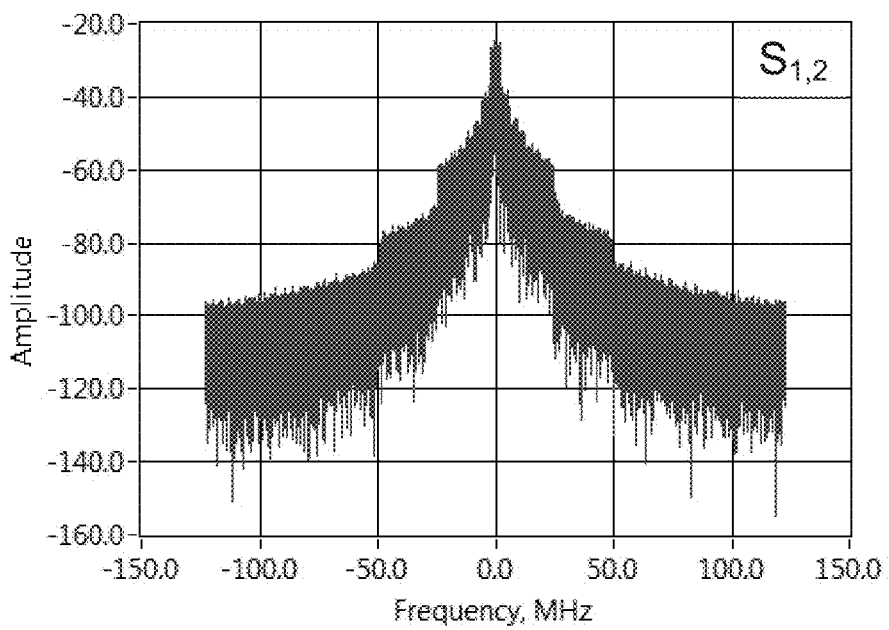
FIG. 7B illustrates the spectrum of a branch signal following two steps of filtering and reassertion.

FIG. 7B shows the spectrum of the branch signal after two iterations of filtering and reassertion. As can be seen the signal power (amplitude) at wide bandwidths is further reduced.

Typically, the filtering and reassertion is repeated for a fixed number of iterations, for example four iterations. The fixed number depends on the type of signal, and the requirements of the output signal. In other examples, the filtering and reassertion is repeated until a threshold criteria is met. The threshold criteria may be a predetermined number of iterations, a predetermined processing time, or a predetermined change in the signal. In some situations, multiple threshold criteria may be used, and the filtering and reassertion stopped when the first criteria is met.

Since the filtered and reasserted signal has reduced power at wide bandwidths, the bandwidth (and hence power) requirements of the amplifier 100 architecture is reduced. Being able to use an operating bandwidth lower than would be required to generate a full bandwidth outphasing signal means lower component and system cost, lower power consumption, and offers increased scope for integration.

Comparing FIG. 3B with FIG. 7B shows that, for the example discussed, the signal level at wide bandwidths can be reduced by 30 dB with two iterations of filtering and reassertion. In this example, the digital to analogue converters used in the system (including in the baseband unit 200) without the filtering and reassertion are required to have a bandwidth of 100 MHz. With two iterations of filtering and processing, this can be reduced to 50 MHz.

The processing circuitry 400 can be implemented in a field programmable gate array (FPGA) or a complementary metal-oxide semiconductor (CMOS) integrated circuit. It is also compatible with CMOS drivers for the branch amplifiers.

Based on the above, an amplifier 100 including the processing circuitry can be implemented in a single chip, although this is not necessary.

The iterations of filtering and reasserting may be provided by routing the signal through the same processing circuitry 400 a number of times. Alternative, separate processing circuitry 400 can be provided for each iteration. In this example, or examples with software implemented filters, the pass band of the filter may change for each iteration. Alternatively, the pass band may be the same for each iteration.

The method 300 of mitigating bandwidth expansion (and the processing circuitry 400) is compatible with any outphasing amplifier 100 used to amplify an amplitude modulated RF signal. Furthermore, although in the above description, the RF signal is only amplitude modulated, the method 300 of mitigating bandwidth expansion can also be used with signals that have both amplitude and phase modulation. In this case, the first and second branch signals both have a common part containing the phase information from the original signal, and an antiphase part containing the amplitude information from the original signal.

For example, the method 300 and circuitry 400 may be used with signals defined by standards such as LTE, WCDMA, GSM-EDGE, Bluetooth, various 802.11 standards, and modulation schemes such as QAM, OFDMA, and many others requiring amplitude as well as phase domain modulation.

Different types of signals will have different bandwidth requirements for the digital to analogue converters and other components. Other constraints of a typical system design require the components (DACs and modulators in particular) to have a bandwidth of between three and five times greater than the sample rate, and the sample rate is greater than the bandwidth of the signal being processed.

To account for bandwidth expansion, without filtering and reassertion, the bandwidths of the signals are theoretically infinite but in practice components are often scaled for between eight and ten times the bandwidth of the input signal. After filtering and reassertion, the components can have a bandwidth limited by the existing system constraints, so that the bandwidth is between three and five times the bandwidth of the input signal.

In the example discussed above, the bandwidth requirements without the filtering and reassertion are 100 MHz. This can be reduced to 50 MHz by including two iterations of filtering and reassertion. This may be, for example, a signal with bandwidth of 10 MHz. In other examples, the bandwidth may be lower or higher. For example, a WCDMA signal of 5 MHz bandwidth may require between 40 MHz and 50 MHz bandwidth without filtering and reassertion, and between 15 MHz and 20 MHz when using the new technique. It will be evident to those skilled in the art that this concept is as applicable to systems optimised for 100 MHz bandwidth LTE signals as it is to a single 3G 5 MHZ carrier configuration.

It will be appreciated that the method and processing circuitry discussed above is by way of example only, and any suitable method may be implemented in any suitable apparatus. For example, any suitable type of filters, converters and digital to analogue converters may be used. The converters, for example, may be based on algorithms other than a CORDIC algorithm.

Also, the structure of the outphasing amplifier 100 and baseband unit 200 discussed above are given by way of example only. Any suitable outphasing amplifier 100 and baseband unit 200 could be used.

Furthermore, the frequencies and signals discussed above are by way of example only, and any suitable frequencies and signals may be used.

From reading the present disclosure, other variations and modifications will be apparent to the skilled person. Such variations and modifications may involve equivalent and other features which are already known in the art of outphasing amplifiers, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. An outphasing amplifier having:
    a first branch arranged to receive and process a first branch signal, the first branch signal being phase modulated, with constant amplitude envelope; and
    a second branch arranged to receive and process a second branch signal, the second branch signal being phase modulated, with constant amplitude envelope, and at least a portion of the second branch signal anti-phase from the first branch signal,
    wherein each branch includes:
        circuitry arranged to successively process the respective branch signal to reduce the energy in sidebands of the respective branch signal away from the central frequency to generate a filtered magnitude signal, while retaining the phase information in the respective branch signal from an unfiltered signal until a threshold is met;
        the circuitry arranged to generate a filtered and re-asserted branch signal from the filtered magnitude signal and the phase information; and
        an amplifier arranged to amplify the filtered and re-asserted branch signal.

2. The outphasing amplifier of claim 1, wherein the circuitry arranged to process the respective branch signal includes:
    a frequency filter arranged to filter the branch signal to reduce the bandwidth of the branch signal; and
    a reconstructor arranged to modify at least a portion of the filtered branch signal, to reassert the phase information from the unfiltered branch signal.

3. The outphasing amplifier of claim 2, wherein the reconstructor is arranged to modify the phase of at least a portion of the filtered branch signal based on information taken from the unfiltered branch signal.

4. The outphasing amplifier of claim 2, wherein the branch signal comprises information encoded in in-phase and quadrature components, and wherein the filter is arranged to filter the in-phase and quadrature components separately.

5. The outphasing amplifier of claim 4, wherein the reconstructor includes:
    a first converter arranged to convert the filtered in-phase and quadrature components into first magnitude and phase information;
    a second converter arranged to convert the unfiltered in-phase and quadrature components into second magnitude and phase information; and
    a third converter arranged to convert the magnitude of the first magnitude and phase information and the angle of the second magnitude and phase information into output in-phase and quadrature information, the filtered and re-asserted branch signal comprising the output in-phase and quadrature components.

6. The outphasing amplifier of claim 1, wherein:
    the branch signal comprises a first range of frequencies, extending around a central frequency; and
    the processed signal comprises the first range of frequencies, wherein energy in the filtered and re-asserted branch signal away from the central frequency is reduced compared to the unfiltered signal.

7. The outphasing amplifier of claim 1, including:
    a signal separator arranged to receive an amplitude modulated RF input signal, and arranged to generate the first branch signal and the second branch signal from the input signal, such that combination of the processed first branch signal and the processed second branch signal provides an amplified version of the input signal.

8. The outphasing amplifier of claim 7, wherein the input signal comprises information encoded in in-phase and quadrature components, the outphasing amplifier comprising:
   a first digital to analogue converter for generating the in phase component of the input signal; and
   a second digital to analogue converter for generating the quadrature component,
      wherein the reduction of energy in the sidebands reduces the required operational bandwidth of the first digital to analogue converter and the second digital to analogue converter.

9. A base station for mobile phone or cellular communications, comprising an amplifier as claimed in claim 1.

10. A method for mitigating bandwidth expansion in an outphasing amplifier, the outphasing amplifier including a first branch arranged to receive and process a first branch signal, the first branch signal being phase modulated, with constant amplitude envelope, and a second branch arranged to receive and process a second branch signal, the second branch signal being phase modulated, with constant amplitude envelope, and at least a portion of the second branch signal anti-phase from the first branch signal, the method including, in each branch:
   successively processing the respective branch signal to reduce energy in sidebands of the respective branch signal away from the central frequency to generate a filtered magnitude signal, while retaining the phase information in the respective branch signal from an unfiltered signal until a threshold is met
   generate a filtered and re-asserted branch signal from the filtered magnitude signal and the phase information; and
amplifying the filtered and re-asserted branch signal.

11. The method of claim 10, wherein processing the respective branch signal includes:
   filtering the branch signal to reduce the bandwidth of the branch signal; and
   modifying at least a portion of the filtered branch signal, to reassert the phase information from the unfiltered branch signal.

12. The method of claim 11, wherein modifying at least a portion of the filtered branch signal includes:
   modifying the phase of at least a portion of the filtered branch signal based on information taken from the unfiltered branch signal.

13. The method of claim 11, wherein the branch signal comprises information encoded in in-phase and quadrature components, and wherein the filter filters the in-phase and quadrature components separately.

14. The method of claim 13, including
   converting the filtered in-phase and quadrature components into first magnitude and phase information;
   converting the unfiltered in-phase and quadrature components into second magnitude and phase information; and
   converting the magnitude of the first magnitude and phase information and the angle of the second magnitude and phase information into output in-phase and quadrature information, the filtered and re-asserted branch signal comprising the output in-phase and quadrature components.

* * * * *